United States Patent [19]

Klingenberg

[11] 4,004,261
[45] Jan. 18, 1977

[54] CONNECTION DEVICE
[75] Inventor: Alfred Simeon Klingenberg, Whippany, N.J.
[73] Assignee: Bell Telephone Laboratories, Incorporated, Murray Hill, N.J.
[22] Filed: Apr. 11, 1975
[21] Appl. No.: 567,184
[52] U.S. Cl. .............................................. 335/280
[51] Int. Cl.² ........................................ H01F 3/00
[58] Field of Search .................... 335/56, 205, 280; 174/68.5; 200/243

[56] References Cited
UNITED STATES PATENTS

| | | | |
|---|---|---|---|
| 2,015,156 | 9/1935 | Richmond | 335/280 |
| 2,660,640 | 11/1953 | Wolf | 335/280 X |
| 2,668,884 | 2/1954 | Jacobs | 335/280 X |
| 2,732,464 | 1/1956 | Ohl | 200/243 |
| 2,971,071 | 2/1961 | Ovshinsky | 335/280 X |
| 2,972,029 | 2/1961 | Ovshinsky | 335/280 |
| 3,838,317 | 9/1974 | Coyne | 174/68.5 |

Primary Examiner—J. D. Miller
Assistant Examiner—Fred E. Bell
Attorney, Agent, or Firm—A. A. Tirva

[57] ABSTRACT

A connection module has a plurality of connection devices, each including two conductors separated by an insulator having an aperture between the conductors and containing a plurality of magnetic balls. The balls and the conductors are coated with a material having a melting point above 85° F. A magnetic force is used to align and hold the balls between two conductors while sufficient heat is applied to melt the material on the balls and the conductors. Upon cooling, the material on the balls and the conductors solidifies fusing the balls and the conductors together into a permanent connection.

8 Claims, 4 Drawing Figures

CONNECTION DEVICE

BACKGROUND OF THE INVENTION

This invention relates to electrical connection devices and, more particularly, to a connection device having movable, magnetic balls coated with a fusible material.

Centralization of common telephone switching equipment in a single location, such as a central switching office, produced the need to provide flexibility of interconnection between outside cable plant and central office equipment. A main distributing frame answers this need by terminating outside plant cable pairs on one side of the frame and inside plant pairs from the central office equipment on the other side of the frame. Basically, a main distributing frame provides a means whereby outside plant cable may be cross-connected to a selected central office circuit by placing a cross-connection, or jumper, wire pair between the appropriate terminal strip appearances on either side of the main distributing frame.

While the main frame functions satisfactorily so long as there is capacity for the addition of new connections, there is also a continuing need to change and rearrange existing cross-connections. This results in high labor costs because all cross-connection changes must be done manually. Also in many cases existing main distributing frames have become completely filled with cross-connection wire pairs making it almost impossible to remove an obsolete cross-connection before placing a new cross-connection. Some main distributing frames have become so congested with active and dead cross-connection wire pairs that new cross-connections cannot be made, and such main distributing frames have had to be abandoned and replaced by new main distributing frames. The installation of new frames requires replacement and termination of cables from outside plant and central office equipment along with replacement of necessary cross-connections.

A main distributing frame having manually wired cross-connections is in essence a large passive switch. A passive switch is a mechanism for making a connection between two leads without an automatic actuator. Such type of switch has a low initial cost but a high operating cost because it requires extensive manual labor during operation. On the other hand, presently known electromechanical or electronic switches which might be used in a main distributing frame can be automated but are too expensive for normal main distributing frame applications. Thus, a need exists for new concepts in providing the cross-connections in main distributing frames in telephone central offices.

U.S. Pat. No. 3,838,317, issued on Sept. 24, 1974 and assigned to the assignee of this invention, discloses a cross-connect switch which may be used to provide cross-examinations in an automated main distributing frame. Although the disclosed switch offers many advantages of existing crosspoint switches, its electrical cross-connections depend upon purely mechanical forces to establish and maintain the connections. This type of electrical connection is susceptible to degradation caused by vibration and corrosion.

Therefore, it is an object to provide another connection device for use in an automated main distributing frame.

Another object is to provide a connection device which is a relatively low cost device.

Yet another object is to provide a connection device which establishes a permanent, fused, electrical connection which will not be degraded by vibration or corrosion causing agents present in a central office.

These and other objects are realized in an illustrative embodiment thereof in which a connection device has first and second conductors separated by an insulator having an aperture between the two conductors. A plurality of magnetic balls is contained within the aperture by the two conductors. Each conductor and each ball is coated with a material having a melting point above 85° F. An attracting magnetic force applied to the balls aligns and holds them in contact between the two conductors while a heat source applies sufficient heat to melt the material on the balls and conductors. Upon cooling, the material solidifies fusing the balls and the conductors together into a permanent connection.

A feature of the invention is the fusible material on the balls and the conductors.

Another feature is a means for heating the material.

A further feature is that the material fuses the balls and the conductors together into a connection between the two conductors.

Yet another feature is an arrangement for breaking the fused connection.

BRIEF DESCRIPTION OF THE DRAWING

A better understanding of the invention may be derived from the detailed description following as that description is considered with respect to the attached drawings, in which.

DETAILED DESCRIPTION

Figure 1A:
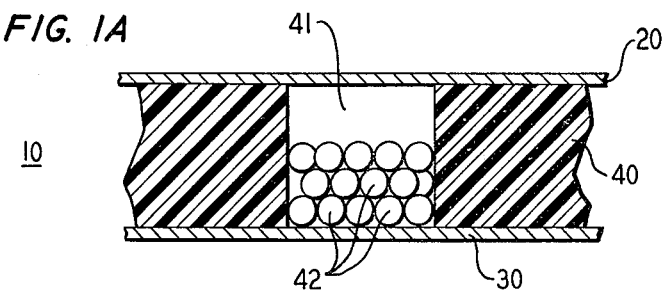
FIGS. 1A through 1C show a cross-sectional view of a connection device.
Figure 1B:
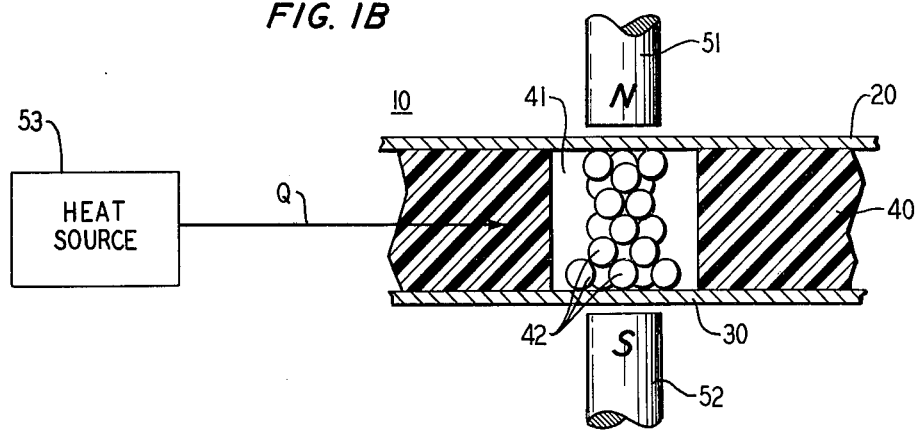
Figure 1C:
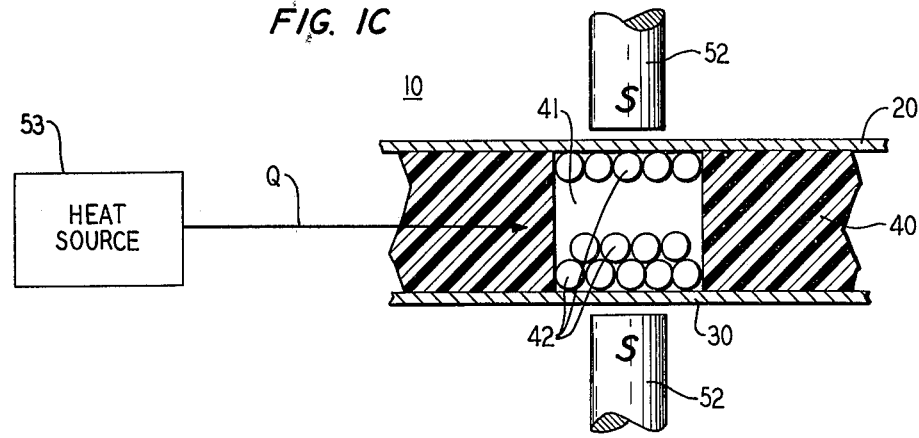

Referring now to FIGS. 1A through 1C, there is shown a cross-sectional view of a connection device 10 having a first conductor 20 and a second conductor 30 separated by an insulator 40. The size of each of the two conductors 20 and 30 is governed by the desired current carrying capacity of each conductor. The insulator 40 has an aperture 41, generally having a cylindrical shape, located between the two conductors 20 and 30. Thickness of the insulator 40 has to be sufficient to prevent electrical arcing between the conductors 20 and 30 through the insulator 40 and through the aperture 41 and the magnetic balls 42 contained therein.

The aperture 41 contains a plurality of magnetic balls 42 having generally similar diameters which are less than or equal to one-half the diameter of the aperture. The balls 42 occupy approximately half of the available space in the aperture 41 and are contained within the aperture by the conductors 20 and 30 which are wide enough to cover both ends of the aperture. Both conductors 20 and 30 and each of the magnetic balls 42 are coated with a material, such as indium, having a melting point above 85° F. assuring that the material is solid at anticipated room temperature.

Referring now to FIG. 1B, there are shown two unlike magnetic poles 51 and 52 developing an attracting magnetic force which aligns and holds the balls 42 in connection between the two conductors. Once the balls have established an electrical connection, which can be determined by taking a resistance reading across the two conductors, a heat source 53 applies sufficient heat Q to the device 10 to melt the material on the balls and the conductors without, however, adversely affecting any other elements comprising the connection device 10. The attracting magnetic force pulls the balls 42 together through the melted material until the balls make ball-to-ball contact. The displaced material covering the balls forms a fillet around the points of contact increasing the contact surface area between the balls in contact with each other. The heat source 53 may comprise an infrared heating device, a laser, an inductive-type heater or any other device capable of applying heat to the connection device. Upon terminating of heating, the melted material solidifies fusing the balls and the conductors together into a permanent electrical connection. This type of electrical connection resists degradation caused by vibration and corrosion.

Referring now to FIG. 1C, there is shown an arrangement for removal of the fused connection between the two conductors 20 and 30. The removal is accomplished in the following manner. First, a repulsing magnetic force, developed by two like magnetic poles 52, is applied to the fused connection so that the balls repel one another. Second, heat source 53 applies sufficient heat Q to melt the material on the balls and the conductors. Once the material melts, the repulsing magnetic force scatters the balls 42 breaking the connection between the two conductors.

Figure 2:
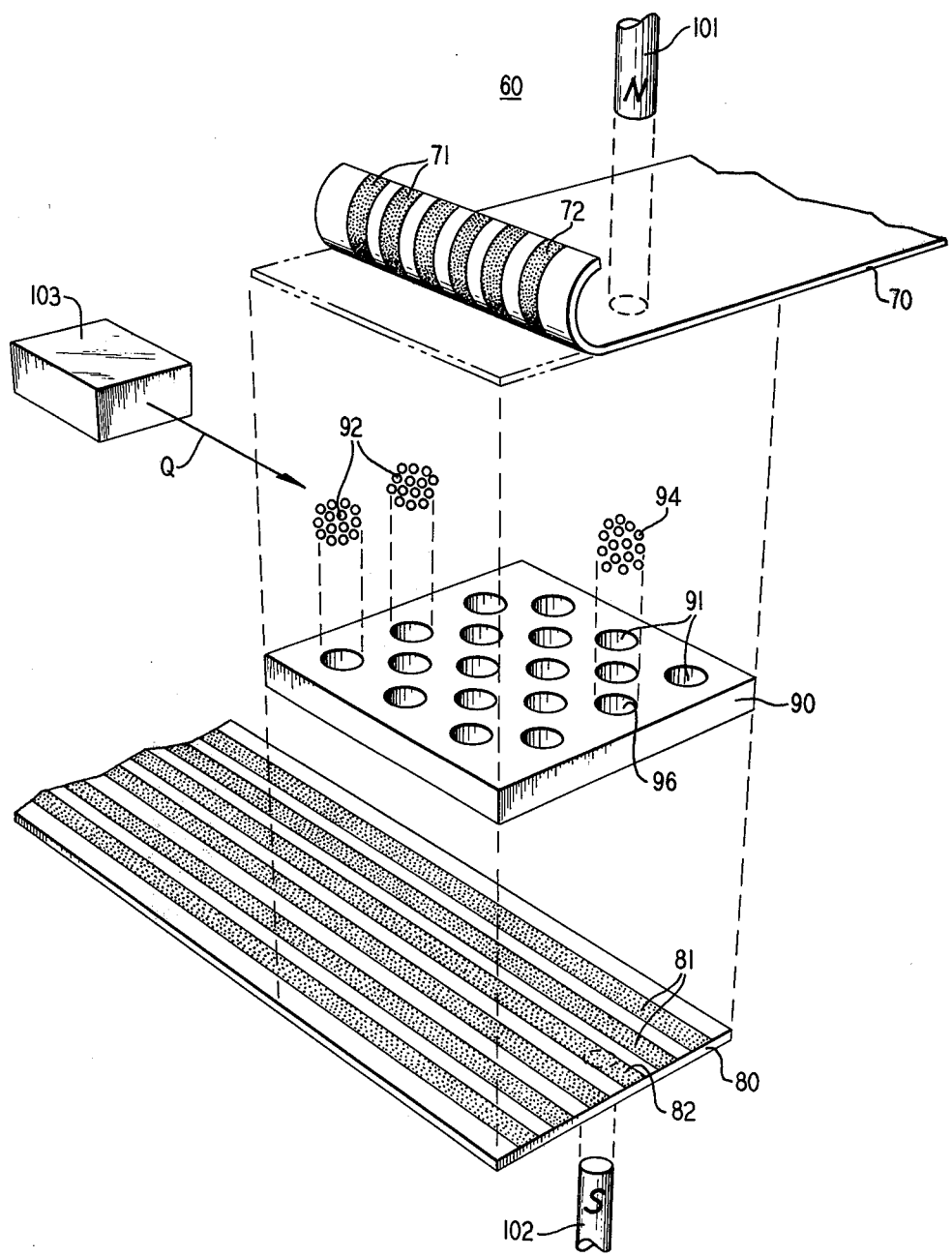
FIG. 2 shows an exploded perspective view of a connection module containing a plurality of connection devices similar to the connection device shown in FIG. 1.

Referring now to FIG. 2, there is shown an alternative embodiment of the invention depicting a connection module 60, which module is especially adapted to be utilized for making cross-connections at a telephone main distributing frame. The connection module 60 has a plurality of connection devices, each device being similar to the connection device 10 shown in FIGS. 1A through 1C, and first and second flat conductor cables 70 and 80. The first flat conductor cable 70 has a first plurality of metallic conductors 71, and the second flat conductor cable 80 has a second plurality of metallic conductors 81, the two pluralities of conductors being orthogonally oriented. An insulator 90 separates the first and second pluralities of conductors and has a plurality of apertures 91 which are located at cross-points of the conductors of the first and second pluralities. A different plurality of magnetic balls 92 is located in each aperture 91, and the balls of each plurality are contained within the apertures 91 by the conductors of the first and second pluralities. All the magnetic balls and all the conductors are coated with a material having a melting point above 85 degrees F.

To establish a connection between two particular conductors 72 and 82, an attracting magnetic force, developed by unlike magnetic poles 101 and 102, is applied to a plurality of magnetic balls 94 within an aperture 96 located at the cross-point of the two selected conductors. Once the magnetic force aligns the balls so that they establish an electrical connection between the two conductors at the selected cross-point, a heating source 103 applies sufficient heat Q to melt the material on the balls and the conductors without, however, adversely affecting any other cross-points comprising the connection module 60. Upon cooling, the melted material solidifies fusing the balls and the conductors together into a permanent connection between the two selected conductors.

To break an established, fused connection between two selected conductors, a similar procedure is followed as was described in the discussion of the connection device 10 shown in FIG. 1. First, a repulsing magnetic force is applied to the balls so that they repel one another, and then the material fusing the balls and the conductors together is heated until it melts permitting the balls to scatter.

It is to be understood that the above-described arrangements are illustrative of the application of the principles of the invention. While the illustrative embodiments describe and depict connection devices having conductors, magnetic balls, insulating separators, and magnetic forces developed by magnets, the scope of the invention is not so limited. Numerous other arrangements may be devised by those skilled in the art without departing from the spirit or scope of the invention.

What is claimed is:

1. A connection device comprising:
   first and second conductors each coated with a material having a melting point above 85° F;
   an insulator separating the two conductors, the insulator having an aperture between the two conductors;
   a plurality of magnetic balls contained within the aperture by the two conductors, each ball being coated with the material;
   means for magnetically aligning the balls to establish an electrical connection between the two conductors; and
   means for heating the material to its melting point, which material upon termination of heating solidifies fusing the balls and the conductors together into a permanent connection between the conductors.

2. A connection device in accordance with claim 1 further comprising:
   means for magnetically repelling the balls, the heating means reheating the material to its melting point for scattering the balls and thereby breaking the electrical connection.

3. A connection device in accordance with claim 2 wherein each conductor is wide enough to cover one end of the aperture.

4. A connection device in accordance with claim 3 wherein the diameter of each magnetic ball is less than or equal to one-half the diameter of the aperture.

5. A connection device in accordance with claim 4 wherein the aperture is filled approximately half full of magnetic balls.

6. A connection device in accordance with claim 5 wherein the material is indium.

7. A connection module comprising:
   first and second flat conductor cables, the first cable having a first plurality of conductors and the second cable having a second plurality of conductors, the two pluralities being orthogonally oriented;
   an insulator separating the first and second pluralities of conductors, the insulator having a plurality of apertures at cross-points of the conductors of the two pluralities;
   a different plurality of magnetic balls contained within each aperture by one conductor of each of the first and second pluralities of conductors, each ball and each conductor being coated with a material having a melting point above 85° F;

means for magnetically aligning the balls at one selected cross-point to establish an electrical connection between conductors of the first and second pluralities; and means for heating the material to its melting point, which material upon termination of heating solidifies fusing the balls and the conductors together into a permanent connection between the conductors.

8. A connection module in accordance with claim 7 further comprising:

means for magnetically repelling the balls at the one selected cross-point, the heating means reheating the material to its melting point for releasing the balls to scatter thereby breaking the electrical connection.

* * * * *